(12) United States Patent
Huque et al.

(10) Patent No.: US 8,946,658 B2
(45) Date of Patent: Feb. 3, 2015

(54) DEVICE FOR DISTURBING THE OPERATION OF AN INTEGRATED CIRCUIT

(75) Inventors: Thierry Huque, Ramillies (BE); Jean-Louis Modave, Ottignies (BE)

(73) Assignee: Proton World International N.V., Zaventem (BE)

( * ) Notice: Subject to any disclaimer, the term of this patent is extended or adjusted under 35 U.S.C. 154(b) by 210 days.

(21) Appl. No.: 13/444,349

(22) Filed: Apr. 11, 2012

(65) Prior Publication Data

US 2012/0261594 A1    Oct. 18, 2012

(30) Foreign Application Priority Data

Apr. 13, 2011 (FR) ...................................... 11 01133

(51) Int. Cl.

| | | |
|---|---|---|
| *G01R 31/309* | (2006.01) | |
| *G01R 31/308* | (2006.01) | |
| *G01R 31/28* | (2006.01) | |
| *G01R 31/00* | (2006.01) | |
| G01R 31/311 | (2006.01) | |
| G01R 31/317 | (2006.01) | |

(52) U.S. Cl.
CPC .......... *G01R 31/308* (2013.01); *G01R 31/2881* (2013.01); *G01R 31/002* (2013.01); *G01R 31/311* (2013.01); *G01R 31/31719* (2013.01)
USPC ..................................... 250/492.1; 250/492.3

(58) Field of Classification Search
USPC ........................................... 250/492.1, 492.3
See application file for complete search history.

(56) References Cited

U.S. PATENT DOCUMENTS

| | | | | |
|---|---|---|---|---|
| 6,859,031 | B2 * | 2/2005 | Pakdaman et al. .............. 324/233 |
| 7,450,245 | B2 * | 11/2008 | Woods et al. .................. 356/484 |
| 7,723,703 | B2 * | 5/2010 | Yamauchi et al. ......... 250/492.1 |
| 2007/0002329 | A1 | 1/2007 | Kasapi et al. | |
| 2007/0245956 | A1 * | 10/2007 | Ruuttu et al. ................. 118/620 |
| 2009/0046757 | A1 * | 2/2009 | Miyairi et al. ................ 372/101 |
| 2009/0166562 | A1 * | 7/2009 | Atkin .......................... 250/492.1 |
| 2010/0156451 | A1 | 6/2010 | Chua et al. | |
| 2011/0180729 | A1 * | 7/2011 | Kafka et al. ............... 250/492.1 |

FOREIGN PATENT DOCUMENTS

| | | |
|---|---|---|
| DE | 39 14 584 A1 | 1/1990 |
| EP | 0 291 276 A2 | 11/1988 |

OTHER PUBLICATIONS

Moreno, "Laser Injection of Soft Faults for the Validation of Dependability Design", Oct. 28, 1999, Journal of Universal Computer Science, vol. 5, No. 10.*

Lewis et al., "Front Side and Backside OBIT Mappings applied to Single Event Transient Testing", Microelectronics Reliability, Elsevier Science Ltd, GB, vol. 41, No. 9-10, p. 1471-1476 (2001).*

French Search Report and Written Opinion dated Mar. 20, 2012 from corresponding French Application No. 11/01133.

Elena Trichina et al: *Multi Fault Laser Attacks on Protected CRT-RSA*, Fault Diagnosis and Tolerance in Cryptography (FDTC), 2010 Workshop on, IEEE, Piscataway, NJ, U.S.A., Aug. 21, 2010, pp. 75-86, XP031756996.

Lewis D et al: *Front Side and Backside OBIT Mappings applied to Single Event Transient Testing*, Microelectronics and Reliability, Elsevier Science Ltd, GB, vol. 41, No. 9-10, Oct. 1, 2001, pp. 1471-1476, XP002417885.

* cited by examiner

*Primary Examiner* — Phillip A Johnston
*Assistant Examiner* — Hsien Tsai
(74) *Attorney, Agent, or Firm* — Seed IP Law Group PLLC

(57) ABSTRACT

A system for injecting faults by laser beams into an electronic circuit including: at least two lasers capable of emitting approximately parallel beams; at least one optical system receiving, on the magnifying side, the beams; and a support of the integrated circuit placed on the reducing side of the optical system.

16 Claims, 2 Drawing Sheets

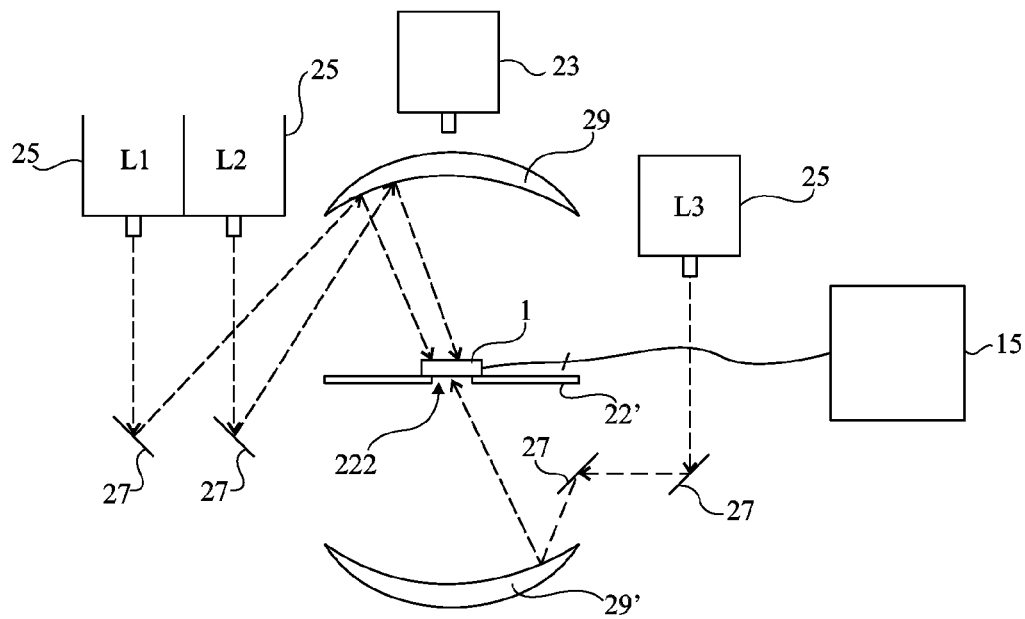
Fig 3
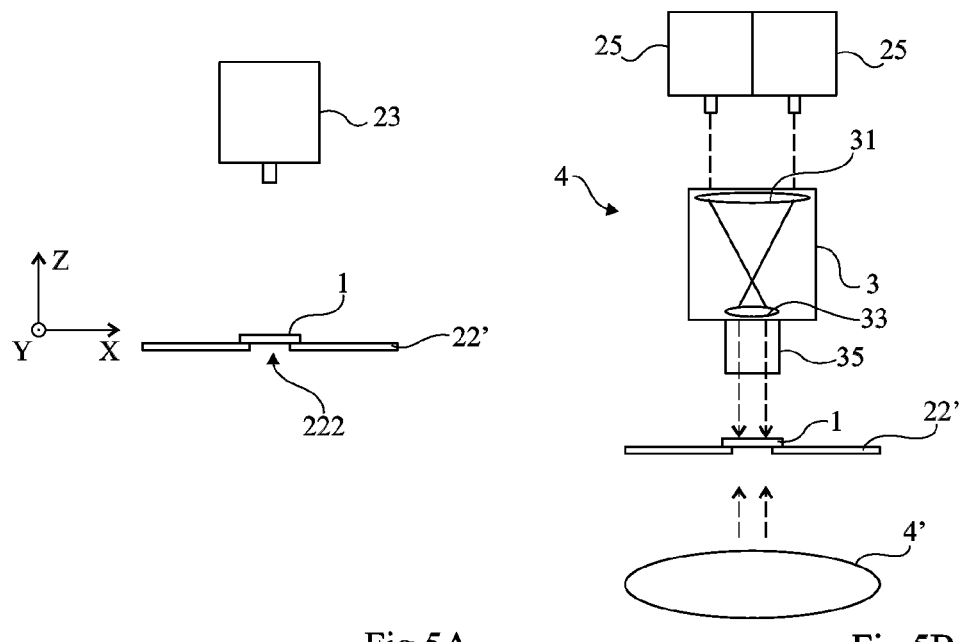
Fig 5A
Fig 5B

DEVICE FOR DISTURBING THE OPERATION OF AN INTEGRATED CIRCUIT

CROSS REFERENCE TO RELATED APPLICATIONS

This application claims the priority benefit of French patent application number 11/01133, filed on Apr. 13, 2011, entitled DEVICE FOR DISTURBING THE OPERATION OF AN INTEGRATED CIRCUIT, which is hereby incorporated by reference to the maximum extent allowable by law.

BACKGROUND

1. Technical Field

Embodiments generally relate to electronic circuits and, more specifically, to a system for testing or attacking an integrated circuit by optical means.

2. Discussion of the Related Art

In electronics, security modules (for example, bank chip cards, subscriber identification units, etc.) are circuits containing data which are desired to be kept confidential or, at least, which are desired to have a controlled distribution. Such data, for example, are encryption algorithm keys, authentication or identification codes, etc., or even algorithms implemented for the encryption, the authentication, or the identification. A security module defines an electronic circuit for securely executing applications and guaranteeing the security (secret/integrity) of data manipulated by such applications.

Many techniques that may be implemented by hackers or attackers intending to discover the secrets contained in these circuits are known. Among the most current attacks, the attacker attempts to cause an error in the circuit manufacturing, be it to generate a trap in the program executed by the circuit or to force values taken by certain bits. Such attacks known as fault-injection attacks are carried out in multiple ways, for example, by disturbing the circuit power supply, a clock signal, etc. Such attacks may be interpreted in various ways, for example by side channels (by analyzing the power consumption of the electronic circuit when it executes the algorithms, or its electromagnetic radiation, or directly signals provided by the circuit).

Among fault injection attacks, embodiments relate to attacks exploiting laser beams disturbing the circuit operation with their rays. Such attacks have become increasingly accurate as the laser beam focusing capacity increases, and presently enable to direct a sufficiently thin and accurate beam onto a logic gate, or even a transistor, to cause its state switching.

The very existence of such attack requires for manufacturers to be able to test the resistance of the circuits that they manufacture against such attacks and, regarding laser attacks, the tests amount to implementing the attack on a circuit and making sure that this attack does not enable to discover the secret of the circuit.

The bulk of laser devices as compared with the size of the circuit makes it currently difficult to carry out attacks with multiple beams. Now, more and more, buyers and distributors of such circuits require for them to be protected against multiple-beam attacks.

There thus is a need for a test bench or attack bench, capable of simultaneously sending several laser beams to different locations of an electronic circuit.

SUMMARY

An embodiment provides a fault injection attack bench or a bench for testing the resistance of a circuit against such attacks by means of laser beams.

Another embodiment provides a system capable of reaching the integrated circuit with laser beams on both surfaces of the circuit.

Thus, an embodiment provides a system of fault injection by laser beams in an electronic circuit comprising:
 at least two lasers capable of emitting approximately parallel beams;
 at least one optical system receiving, on the magnifying side, said beams; and
 a support of the integrated circuit placed on the reducing side of the optical system.

According to an embodiment, the optical system is formed of a telescope, the laser beams being applied on the magnifying side of the telescope.

According to an embodiment, laser beams are applied to both surfaces of the electronic circuit.

An embodiment provides a system for testing the resistance of an electronic circuit against fault injection attacks, comprising an attack system of the above type.

The foregoing and other objects, features, and advantages will be discussed in detail in the following non-limiting description of specific embodiments in connection with the accompanying drawings.

BRIEF DESCRIPTION OF THE DRAWINGS

FIG. 3 is a simplified representation of an embodiment of an attack or test system;

FIGS. 5A and 5B are simplified views illustrating an embodiment of the system of FIG. 4.

DETAILED DESCRIPTION

Figure 1:
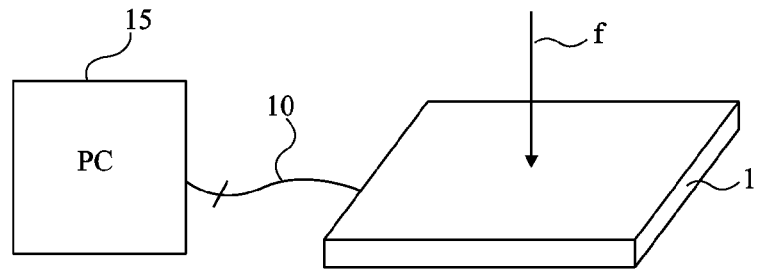
FIG. 1 is a simplified representation of a test or laser beam attack system of the type to which the present invention applies.

The same elements have been designated with the same reference numerals in the different drawings, which have been drawn out of scale. For clarity, only those steps and elements which are useful to the understanding of the present disclosure have been shown and will be described. In particular, the internal structure of the integrated circuits submitted to the test or to the attacks which will be described has not been detailed, the present invention being compatible with usual integrated circuits. Further, the lasers used for the implementation of the described embodiments have not been described either, such embodiments being here again compatible with usual lasers.

FIG. 1 very schematically shows the elements of a system of laser attack or test against laser beam attacks aiming at injecting faults in an integrated circuit.

An electronic circuit or an integrated circuit chip 1 is arranged so that a laser beam f hits integrated circuit 1 on a region which is desired to be attacked or tested. The contacts (not shown) of the integrated circuit are connected (connection 10) to a device 15 for exploiting the measurements, typically a microcomputer or a dedicated electronic circuit also used to synchronize the laser.

The carrying out of such an attack and the interpretation of the results are usual. A fault injection by the laser beam is caused, focused and directed to a specific location of the chip, and the consequences of this fault injection are examined either by direct analysis of the signals, or by side-channel analysis (consumption, radiation . . . ).

Figure 2:
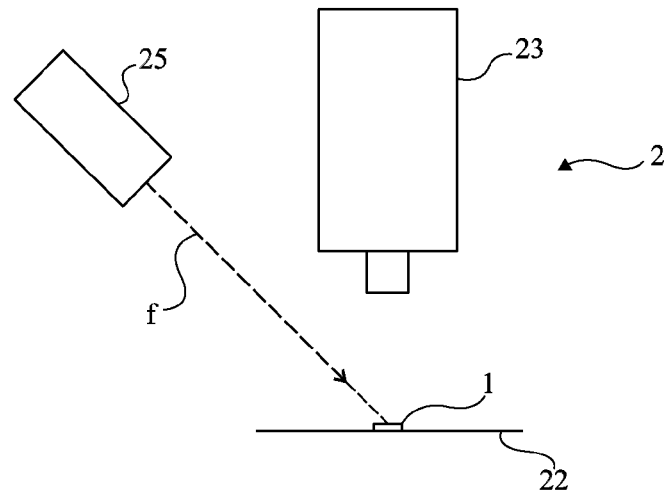
FIG. 2 is a representation of a usual attack or test system.

FIG. 2 is a simplified representation of a usual installation 2 of attack or test of an integrated circuit by means of a laser. Chip 1 is laid on a support 22 under a microscope 23. The function of the microscope is to determine the location where laser beam f emitted by a laser 25 must hit the chip. Indeed, the dimensions of an integrated circuit are such that nothing is visible to the naked eye and that the sighting should be performed by means of a microscope. As compared with the size of the integrated circuit, the installation is particularly bulky and, in particular, does not enable an attack of laser beam f with an incidence perpendicular to the integrated circuit surface.

Further, with a conventional bench such as illustrated in FIG. 2, it is not possible to to simultaneously inject several faults in the integrated circuit by means of several laser beams. In particular, there is not enough room for attacks to be performed with a sufficient accuracy.

Another difficulty is to be able to simultaneously perform attacks on both surfaces of the chip.

To attack the circuit with several beams, it could have been devised to equip the installation with a mirror system bringing the different beams back towards the circuit.

FIG. 3 is a simplified view of an embodiment of a system of attack or test by laser fault injection on an integrated circuit according to this solution.

Integrated circuit 1 is still placed on a table 22' which, in this example, comprises an opening 222 under integrated circuit 1 to be attacked or tested. A microscope 23 is used to set, for example, three lasers 25 (L1, L2, L3). To reach different areas of circuit 1 despite the significant bulk of lasers 25 with respect to the size of circuit 1, each laser is associated with mirrors 27 and 29 redirecting the beams towards circuit 1.

In the example of FIG. 3, an attack on both surfaces of the integrated circuit is assumed. For example, two laser beams L1 and L2 are reflected by mirrors 27 towards a concave mirror 29 located above the circuit while a third beam originating from laser L3 is directed by a mirror assembly 27 towards a concave mirror 29' located under the circuit.

The use of concave mirrors enables to redirect the beams and, in a way, to focus them towards the integrated circuit, despite the fact that the lasers are apart from each other, and to keep the use of microscope 23.

Such a solution also enables to attack the circuit on both its surfaces.

However, it remains difficult to set, since laser beams do not attack the circuit with an orthogonal direction.

Figure 4:
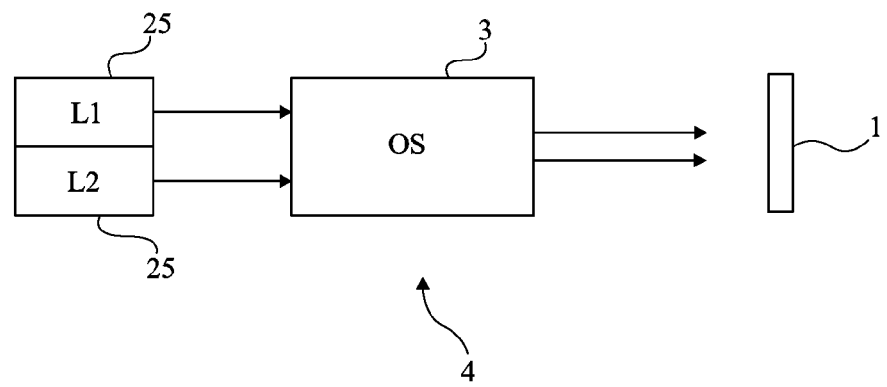
FIG. 4 is a simplified representation of another embodiment of an attack or test system.

FIG. 4 shows a simplified view of a preferred embodiment of a system 4 according to which several laser beams, in the present example originating from two lasers 25 (L1 and L2), cross a telescope-type optical system 3 (OS) before reaching integrated circuit 1. The telescope-type optical system is used conversely to a normal use, that is, the laser beams are applied to the telescope lens on the magnifying portion side. As a result, the beams come out tight, but remain parallel to one another to attack circuit 1.

The (reverse) use of a telescope-type optical system also has the advantage that it provides a focusing system enabling a focusing in the beam direction.

FIGS. 5A and 5B are simplified representations of an example of use of one or several systems 4.

FIG. 5A very schematically shows a table 22' for receiving the circuit to be attacked or to be tested. As in the embodiment of FIG. 3, the table comprises an opening 222 under circuit 1 enabling, if need be, an attack from the back side. A microscope-type sighting system 23 is for example used to set the circuit position in directions X and Y (table plane). As a variation, the circuit is randomly scanned to calibrate a first shooting and position X, Y at which the circuit responds is stored.

Once the X and Y position has been set, a telescope system 4 of the type of that in FIG. 4. To keep the sighting, any usual mechanical setting means may be used. For example, the two devices are supported by a turntable off-centered with respect to the circuit, the respective axes of the devices being on a same circle of the turntable.

FIG. 5B illustrates the position in which system 4 is then placed directly above circuit 1. FIG. 5B also illustrates the reverse use of telescope 3, showing magnifying lens 31 on the side of lasers 25 and the sighting lens on the side of circuit 1. FIG. 5A also illustrated an optical system equipped, on the side of lens 33, with an objective enabling a vertical focusing.

Finally, a similar system 4' may be provided to attack the other surface (the lower surface in the orientation of the drawings) of circuit 1.

For example, the laser beams provided by lasers 25 are distributed across a diameter on the order of 2 mm at the entrance of telescope 3 to come out gathered within a diameter on the order of one micrometer enabling to disturb the operation of the integrated circuit.

Various embodiments have been described, various alterations and modifications will occur to those skilled in the art. In particular, the practical implementation of embodiments and especially the selection of the telescope (for example, with a mirror) is within the abilities of those skilled in the art based on the functional indications given hereabove. In particular, reference has been made to a telescope but the same principle is operative with an optical system of binocular or optical refractor type.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A system for injecting faults by laser beams into an electronic circuit, the system comprising:
   at least two lasers configured to emit approximately parallel first and second beams;
   at least two optical systems having a magnifying side and a reducing side in a reverse telescoping arrangement; and
   an electronic circuit disposed on the reducing side of the at least two optical systems, wherein the at least two optical systems are configured to apply said first and second beams, respectively, to first and second surfaces, respectively, of the electronic circuit,
   wherein the magnifying side of the at least two optical systems is configured to receive one of said first and second beams, and wherein one of the at least two optical systems is configured to apply, via the reducing side, the first beams to the first surface of the electronic circuit with an orientation orthogonal to the surface of the electronic circuit and the other of the two optical systems is configured to apply, via the reducing side, the second beam to the second surface of the electronic circuit with an orientation orthogonal to the surface of the electronic circuit.

2. The system of claim 1, wherein the reverse telescoping arrangement comprises at least two refractive lenses.

3. A system configured to test a resistance of an electronic circuit against fault injection attacks, comprising the fault-injection system of claim 1.

4. The system of claim 1, wherein the lasers are configured to emit the approximately parallel beams with respective diameters of approximately 2 mm, and wherein the at least two optical systems are configured reduce the respective diameters of the parallel beams to approximately 1 μm.

5. The system of claim 1, wherein the at least two optical systems comprises binoculars and/or an optical refractor.

6. The system of claim 1, wherein the at least two optical systems comprises at least two refractive lenses, and wherein the at least two optical systems are configured to pass at least one of the laser beams through the at least two refractive lenses.

7. The system of claim 1, wherein the electronic circuit comprises an integrated circuit.

8. A method comprising:
   using first and second option systems to reduce optical beams, the first and second optical systems having a magnifying side and a reducing side in a reverse telescoping arrangement, the optical beams including a first optical beam and a second optical beam, the first optical beam being approximately parallel to the second optical beam at an input of the optical systems and at an output of the optical systems;
   applying, via the output of the first optical system, the first optical beam to a first surface of an integrated circuit at an angle of incidence orthogonal to the first surface of the integrated circuit; and
   applying, via the output of the second optical system, the second optical beam to a second surface of the integrated circuit at an angle of incidence orthogonal to the second surface of the integrated circuit, the second surface being opposite the first surface.

9. The method of claim 8, wherein using the optical systems to reduce the optical beams comprises reducing respective diameters of the optical beams from approximately 2 mm at the input of the optical systems to approximately 1 μm at the output of the optical systems.

10. The method of claim 8, wherein the optical systems each includes at least two refractive lenses, and wherein using the optical systems to reduce the optical beams comprises passing the optical beams through the at least two refractive lenses.

11. The method of claim 8, wherein applying the first and second optical beams to a surface of the integrated circuit comprises applying the first and second optical beams to a same surface of the integrated circuit.

12. The method of claim 8, wherein applying the first and second optical beams to the surface of the integrated circuit injects a fault into an operation of the integrated circuit.

13. The method of claim 8, wherein applying the first and second optical beams to the surface of the integrated circuit switches a state of a transistor and/or a logic gate of the integrated circuit.

14. The method of claim 8, wherein the optical system comprises a binocular optical system, and/or at least one refractive lens.

15. The method of claim 8, wherein the first optical beam is approximately parallel to the second optical beam between the output of the optical systems and a surface of the integrated circuit.

16. The method of claim 8, wherein the optical beams comprise laser beams.

\* \* \* \* \*

UNITED STATES PATENT AND TRADEMARK OFFICE
CERTIFICATE OF CORRECTION

| | | |
|---|---|---|
| PATENT NO. | : 8,946,658 B2 | |
| APPLICATION NO. | : 13/444349 | |
| DATED | : February 3, 2015 | |
| INVENTOR(S) | : Huque et al. | |

It is certified that error appears in the above-identified patent and that said Letters Patent is hereby corrected as shown below:

In the claims

Column 5, Line 16, claim 8:
"using first and second option systems to reduce optical" should read, --using first and second optical systems to reduce optical--.

Signed and Sealed this
Twenty-sixth Day of January, 2016

Michelle K. Lee
*Director of the United States Patent and Trademark Office*